(12) United States Patent
Moriya

(10) Patent No.: US 8,288,061 B2
(45) Date of Patent: Oct. 16, 2012

(54) RETICLE AND MANUFACTURING METHOD OF SOLID-STATE IMAGE SENSOR

(75) Inventor: Taro Moriya, Kumamoto (JP)

(73) Assignee: Renesas Electronics Corporation, Kanagawa (JP)

( * ) Notice: Subject to any disclaimer, the term of this patent is extended or adjusted under 35 U.S.C. 154(b) by 220 days.

(21) Appl. No.: 12/826,082

(22) Filed: Jun. 29, 2010

(65) Prior Publication Data

US 2011/0014551 A1 Jan. 20, 2011

(30) Foreign Application Priority Data

Jul. 14, 2009 (JP) .................... 2009-165750

(51) Int. Cl.
*G03F 1/70* (2012.01)
*G03C 5/00* (2006.01)
(52) U.S. Cl. ............... 430/5; 430/30; 430/311
(58) Field of Classification Search ............. 430/5, 30, 430/311, 322; 438/65, 667
See application file for complete search history.

(56) References Cited

U.S. PATENT DOCUMENTS

2010/0092875 A1* 4/2010 Cho ..................... 430/5

FOREIGN PATENT DOCUMENTS

| JP | 2-37773 A | 2/1990 |
| JP | 2-121368 A | 5/1990 |
| JP | 6-45581 A | 2/1994 |
| JP | 2624570 B2 | 4/1997 |
| JP | 10-189423 A | 7/1998 |

* cited by examiner

*Primary Examiner* — Stephen Rosasco
(74) *Attorney, Agent, or Firm* — Foley & Lardner LLP

(57) ABSTRACT

A reticle includes: a repetition pattern; and a peripheral pattern. One of the repetition pattern and peripheral pattern is a first pattern with a first side in a first direction and the other is a second pattern with a second side in the first direction. The first side has a first length equal to or longer than a second length of the second side. The first length is n (n is an integer equal to or larger than 1) times as large as the second length. The first pattern has at least one of first misalignment measurement patterns provided at positions distant by a third length and ((the third length)+(n−1)×(the second length)) from an upper end of the first pattern. The third length is equal to or smaller than the second length. The second pattern has a second misalignment measurement pattern provided at a position distant by the third length from an upper end of the second pattern.

11 Claims, 16 Drawing Sheets

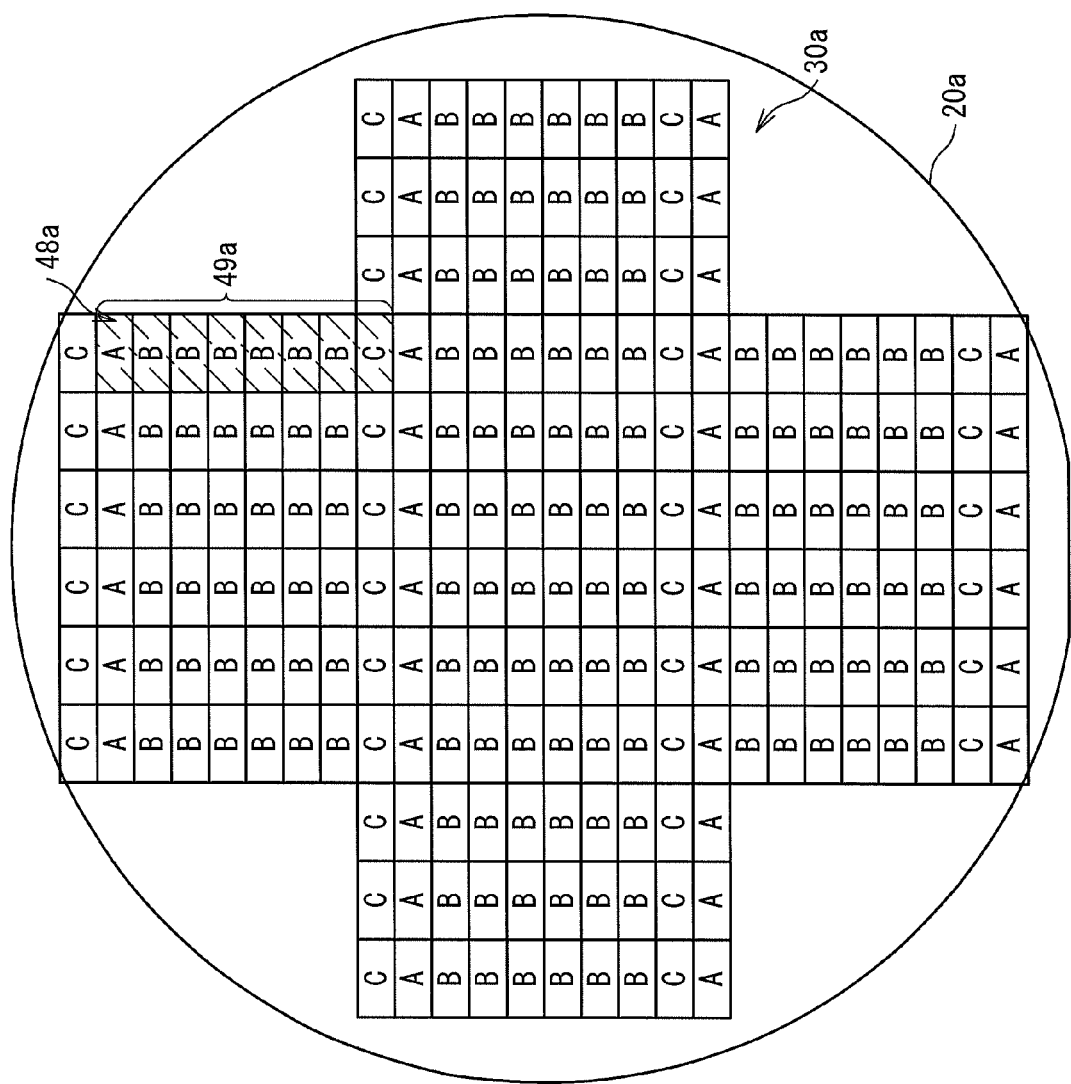

RETICLE AND MANUFACTURING METHOD OF SOLID-STATE IMAGE SENSOR

INCORPORATION BY REFERENCE

This application is based upon and claims the benefit of priority from Japanese patent application No. 2009-165750 filed on Jul. 14, 2009, the disclosure of which is incorporated herein in its entirety by reference.

BACKGROUND OF THE INVENTION

1. Field of the Invention

The present invention relates to a reticle and a method of manufacturing a solid-state image sensor.

2. Description of Related Art

When a chip having a very long side such as a one-dimensional CCD (Charge Coup led Device) is to be formed, a chip larger than an exposure area of an exposure device is formed by exposing a peripheral circuit portion and a multi-repetition portion. FIG. 1 is a schematic diagram showing a typical reticle layout, and FIG. 2 is a schematic diagram showing an exposure shot map 130 on a wafer using a reticle of FIG. 1. When a solid-state image sensor is manufactured, a chip size in a longitudinal direction becomes very long as e.g. 20 nm to 80 nm particularly in a case of a one-dimensional CCD due to a number of pixels thereof and a cell size thereof. Accordingly, a chip pattern cannot be formed only by one exposure when a stepper is used. Therefore, as shown in FIG. 1, a reticle 101 is formed by providing a repetition portion (B) 112, an input portion (A) 111 and an output portion (C) 113. Here, the repetition portion (B) 112 is for a pixel portion having a repetition of the same pattern on one chip. The input portion (A) 111 and the output portion (C) 113 are for a peripheral circuit portion such as an amplifier circuit portion other than the pixel portion. Then, as shown in FIG. 2, in an exposure process, the input portion (A) 111 and the output portion (C) 113 are firstly blinded by an exposure device and only the repetition portion (B) 112 is exposed onto a wafer 120 multiple times. Subsequently, the repetition portion (B) 112 is blinded and the input portion (A) 111 and the output portion (C) 113 are exposed onto the wafer 120 simultaneously. Thus, a desired chip having a longitudinal length 149 is formed. In this example, an exposure for a one-dimensional CCD chip is carried out by four times of exposure shots of the repetition portion (B), one time of exposure shot of the input portion (A) (including an adjacent output portion (C)), and one time of exposure shot of the output portion (C) (including an adjacent input portion (A)), respectively, i.e., total six times of exposure shots.

As a related technique thereto, a manufacturing method of a solid-state image sensor is disclosed in Japanese Patent No. 2624570 B (Patent Literature 1). In this manufacturing method of the solid-state image sensor, a reticle with a chip pattern is mounted to a reduced-projection exposure device, which includes an offset device for parallel-shifting a projection coordinate and a blind device for blinding a part of the reticle, so that the chip pattern is reduced and projected to be transferred onto a wafer. In this manufacturing method of the solid-state image sensor, the chip pattern is previously divided into a plurality of drawing patterns and disposed onto the reticle. A specific drawing pattern is transferred onto the wafer under a condition that the remaining drawing patterns other than the specific drawing pattern among the plurality of drawing patterns are light-shielded by the blind device. Thereafter, under the condition that the remaining drawing patterns other than a drawing pattern adjacent to the specific drawing pattern among the plurality of drawing patterns are light-shielded by the blind device, the drawing pattern to be adjacent is adjusted in position on the wafer by the offset device so that an overlapped width between the specific drawing pattern and the drawing pattern to be adjacent thereto is increased or decreased to be brought adjacent to the specific drawing, and the drawing pattern is transferred onto the wafer.

Also, an exposure method is disclosed in Japanese Patent Publication No. JP-A-Heisei 10-189423 (Patent Literature 2). In this exposure method of a semiconductor chip, a reticle having first to third patterns formed thereon is used. This exposure method of the semiconductor chip includes: a step of exposing the first pattern of the reticle to one end of the semiconductor chip; a step of exposing two or more second patterns to the central part of the semiconductor chip in a certain direction adjacent to the exposed first pattern; and a step of exposing the third pattern to the other end of the semiconductor chip in the certain direction adjacent to the exposed second pattern.

Further, a manufacturing method of a semiconductor device is disclosed in Japanese Patent Publication No. JP-A-Heisei 06-045581 (Patent Literature 3). In this manufacturing method of the semiconductor device, a plurality of semiconductor devices having a plurality of circuit portions of different functions is made into a wafer. This manufacturing method of the semiconductor device includes: at least a first step of repeating a pattern drawing which is achieved by simultaneously exposing any number of circuit portions having a first function in the semiconductor device to thereby execute a pattern drawing of the circuit portions having the first function; and a second step of repeating a pattern drawing which is achieved by simultaneously exposing any number of circuit portions having a second function in the semiconductor device to thereby execute a pattern drawing of the circuit portions having the second function.

A pattern forming method of a charge coupled color line sensor is disclosed in Japanese Patent Publication No. JP-A-Heisei 02-121368 (Patent Literature 4). In this pattern forming method of the charge coupled color line sensor, a pattern is formed through a divided exposure. The pattern forming method of the charge coupled color line sensor is characterized in that the number of bits of a cyclic pattern portion to be formed through the divided exposure is a multiple of 12.

A reticle manufacturing method of a solid-state image sensor is disclosed in Japanese Patent Publication No. JP-A-Heisei 02-037773 (Patent Literature 5). In this reticle manufacturing method of the solid-state image sensor, a pattern for defining a shape of a repeat unit cell including at least one unit light receiving element of a light receiving portion of a solid-state image sensor is drawn by scanning an energy beam flux on a surface of a reticle so that the reticle of the solid-state image sensor is manufactured. In this manufacturing method, it is characterized that a reticle of at least one step of the reticle is manufactured while the number of the unit light receiving elements constituting the repeat unit cell is changed from a reticle in the other step.

We have now discovered the following facts.

In the case of the exposure shot map as shown in FIG. 2, it is necessary to set a virtual exposure shot 148 (hatching portion) corresponding to one piece of the one-dimensional CCD chip as a fundamental step of an automatic misalignment measurement. The reason is as follows. The size of the repetition portion (B) 112, the size of the input portion (A) 111 and the size of the output portion (C) 113 are different from each other in many cases. Therefore, it is difficult to adapt the fundamental step to the sizes of the whole portions even if it is intended to execute the automatic misalignment measurement every fundamental step. Thus, the automatic misalignment measurement cannot be executed every exposure of each portion.

However, as mentioned above, if the virtual exposure shot 148 is set as a fundamental step of an automatic misalignment measurement, there may be possibly considered a case where a longitudinal length 149 of the virtual exposure shot 148 exceeds a size setting limit of an automatic misalignment measurement device, resulting in difficulty of the measurement.

Even if the longitudinal length 149 of the virtual exposure shot 148 is below the size setting limit, there may be considered a case where a misalignment measuring position on the wafer 120 is extremely restricted. For example, in the example shown in FIG. 2, one virtual exposure shot 148 includes four times exposure shots of the repetition portion (B) 112, one time exposure shot of the input portion (A) 111 and one time exposure shot of the output portion (C) 113. At this time, the automatic misalignment measurement can be executed only in any one exposure shot position of the exposure shots of the repetition portion (B) 112, the input portion (A) 111 or the output portion (C) 113 within the virtual exposure shot 148. For example, if a misalignment measurement pattern for use at a time of the automatic misalignment measurement is arranged in the repetition portion (B) 112, there exist four misalignment measurement patterns within the virtual exposure shot 148. However, since the fundamental step of the automatic misalignment measurement is set in the virtual exposure shot 148, the misalignment can be measured only in one position of the four positions. Then, measurable positions of the automatic misalignment measurement can be set only at unevenly distributed positions on the wafer 120, and there arises a problem that accuracy in misalignment compensation is deteriorated.

SUMMARY

The present invention seeks to solve one or more of the above problems, or to improve upon those problems at least in part.

In one embodiment, a reticle includes: a repetition pattern; and a peripheral pattern, wherein one of the repetition pattern and peripheral pattern is a first pattern with a first side in a first direction and the other is a second pattern with a second side in the first direction, the first side having a first length equal to or longer than a second length of the second side, wherein the first length is n (n is an integer equal to or larger than 1) times as large as the second length, wherein the first pattern has at least one of first misalignment measurement patterns provided at positions distant by a third length and ((the third length)+(n−1)×(the second length)) from an upper end of the first pattern, the third length being equal to or smaller than the second length, and wherein the second pattern has a second misalignment measurement pattern provided at a position distant by the third length from an upper end of the second pattern.

In another embodiment, a method of manufacturing a solid-state image sensor, includes: setting a wafer and a reticle to an exposing instrument, wherein the reticle includes: a repetition pattern representing a pixel portion of a CCD (Charge Coupled Device), and a peripheral pattern representing a peripheral circuit portion of the CCD, wherein one of the repetition pattern and peripheral pattern is a first pattern with a first side in a first direction and the other is a second pattern with a second side in the first direction, the first side having a first length equal to or longer than a second length of the second side, wherein the first length is n (n is an integer equal to or larger than 1) times as large as the second length, wherein the first pattern has at least one of first misalignment measurement patterns provided at positions distant by a third length and ((the third length)+(n−1)×(the second length)) from an upper end of the first pattern, the third length being equal to or smaller than the second length, and wherein the second pattern has a second misalignment measurement pattern provided at a position distant by the third length from an upper end of the second pattern; blinding the peripheral pattern and exposing the repetition portion multiple times on the wafer; blinding the repetition portion and exposing the peripheral pattern on the wafer; and carrying out an automatic misalignment measurement using the at least one of first misalignment measurement patterns and the second misalignment measurement pattern.

According to the present invention, it is possible to provide a reticle capable of improving an accuracy of automatic misalignment compensation at a time of exposure and to provide a manufacturing method of a solid-state image sensor capable of improving a designing accuracy and a manufacturing yield.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 8 is a schematic diagram showing an example of an exposure shot map on a wafer using a reticle of FIG. 7;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The embodiment of a reticle and a manufacturing method of a solid-state image sensor according to the present invention will be described with reference to the accompanying drawings. In the present embodiment, in a reticle layout, a relation between a longitudinal length of a repetition portion (B) (or a repetition pattern) and a total longitudinal length of an input portion (A) and an output portion (C) (peripheral pattern) is defined to be an integer ratio. In addition, a longitudinal length of a virtual exposure shot at a time of automatic misalignment measurement is set to be any one of the longitudinal length of the repetition portion (B) or the total longitudinal length of the input portion (A) and the output portion (C). Further, the misalignment measurement patters are disposed on the wafer at equal intervals. Thus, the longitudinal length in the virtual exposure shot in a fundamental step of an automatic misalignment measurement can be reduced and the automatic misalignment measurement positions on the wafer can be increased and it becomes possible to improve an accuracy of compensating a misalignment. Here, each "longitudinal length" is a length in a direction parallel to a longitudinal side of a one-dimensional solid-state image sensor. The explanation thereof is described in details as following.
(First Embodiment)

Figure 3:
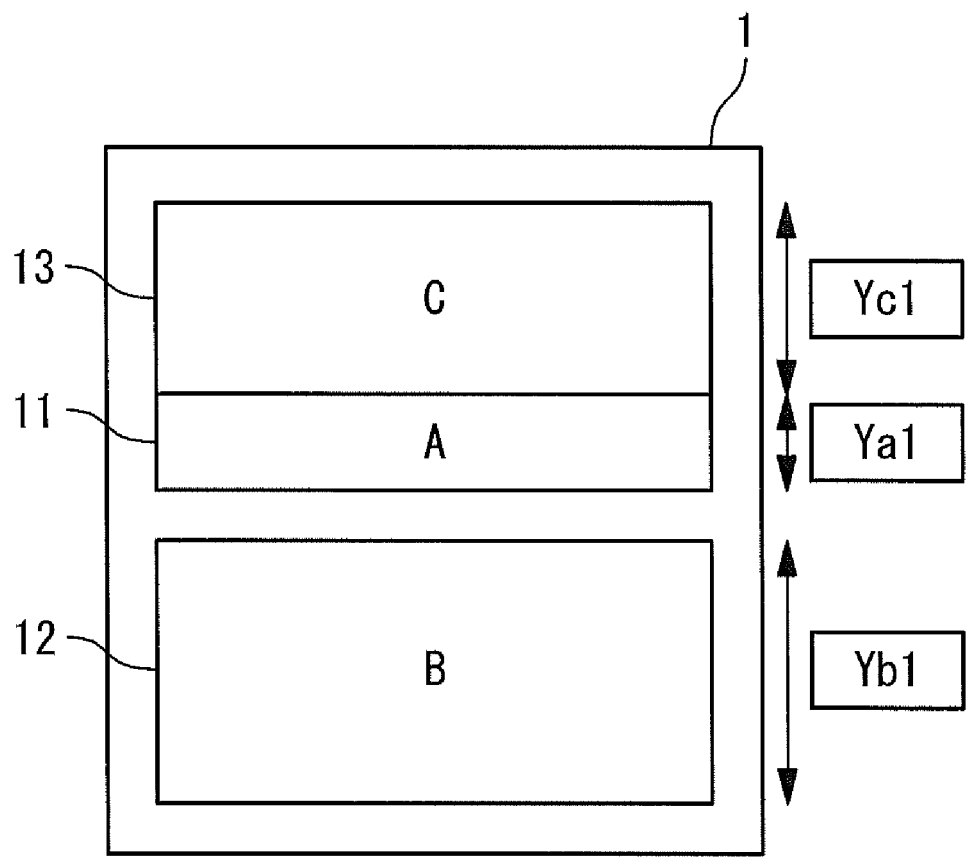
FIG. 3 is a schematic diagram showing an example of a reticle layout according to a first embodiment of the present invention.

A reticle and a manufacturing method of a solid-state image sensor according to a first embodiment of the present invention are described referring to the accompanying drawings. FIG. 3 is a schematic view showing an example of a reticle layout according to the first embodiment of the present invention.

A reticle 1 shown in FIG. 3 is a reticle for use in manufacturing a one dimensional CCD (Charge Coupled Device) chip having a rectangular shape elongated in one side direction. Hereinafter, a longitudinal direction in the chip is merely referred to as "longitudinal direction". The reticle 1 includes a repetition portion (B) 12, an input portion (A) 11 and an output portion (C) 13. The repetition portion (B) 12 is a pattern for exposure of a pixel portion. Here, the pixel portion is formed with identical patterns repeated on the same one chip. The identical pattern corresponds to the repetition portion (B) 12. The input portion (A) 11 and the output portion (C) 13 are patterns for exposing a peripheral circuit portion (e.g., an input circuit portion and an output circuit portion) such as an amplifier circuit portion other than the pixel portion. The repetition portion (B) 12, the input portion (A) 11 and the output portion (C) 13 are provided and aligned in this order from one side.

In this arrangement, it is assumed that a length of the repetition portion (B) 12 in the longitudinal direction is Yb1, a length of the input portion (A) 11 in the longitudinal direction is Ya1, and a length of the output portion (C) 13 in the longitudinal direction is Yc1. At this time, the relation among Yb1, Ya1 and Yc1 is Yb1=Ya1+Yc1. That is, the ratio between the length Yb1 of the repetition portion (B) 12 in the longitudinal direction and the sum Ya1+Yc1 of the length of the input portion (A) 11 in the longitudinal direction and the length of the output portion (C) 13 in the longitudinal direction is an integer ratio of 1:1. In other words, Yb1 is an integral multiple of Ya1+Yc1 (herein, single), or Ya1+Yc1 is an integral multiple of Yb1 (i.e., n times (n is an integer of 1 or more), herein n=1).

Figure 4:
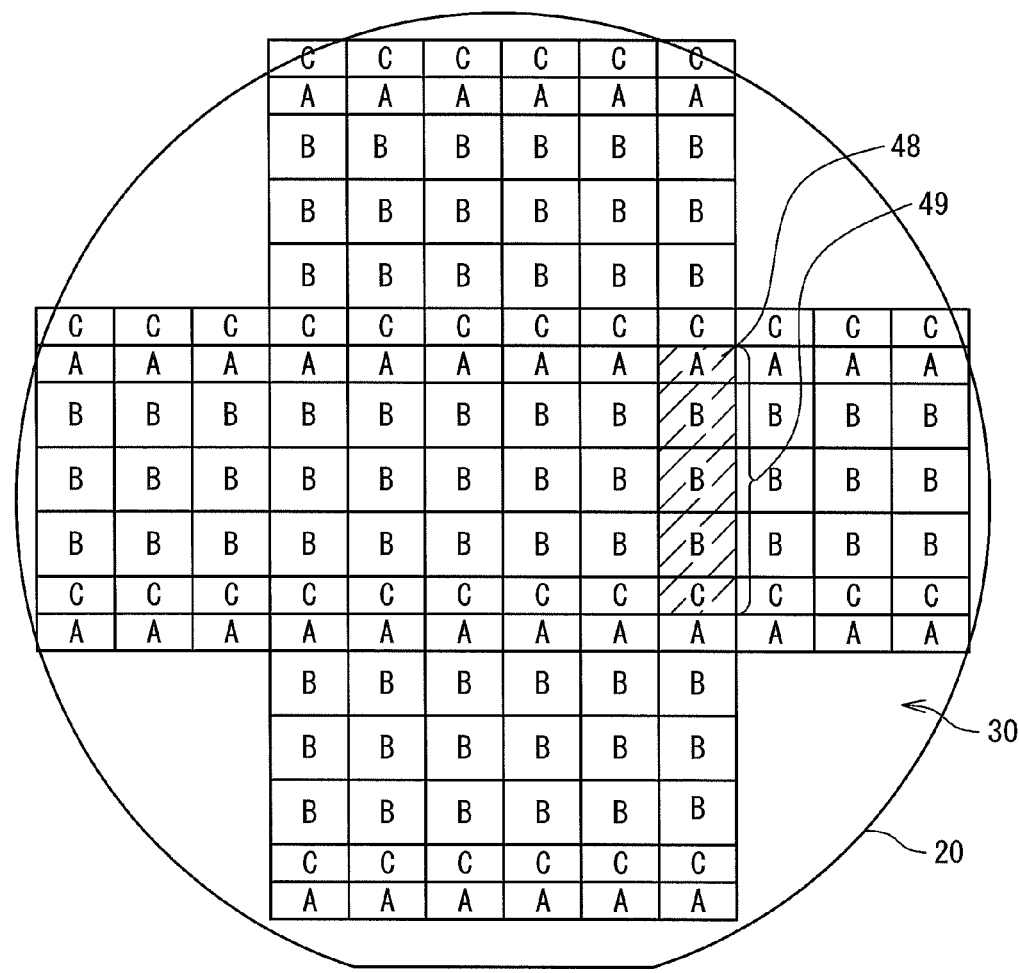
FIG. 4 is a schematic diagram showing an example of an exposure shot map on a wafer using a reticle of FIG. 3.

FIG. 4 is a schematic diagram showing an example of an exposure shot map 30 on a wafer using the reticle (integer ratio of 1:1) of FIG. 3. In an exposure step, the repetition portion (B) 12 is first blinded, and the output portion (C) 13 and the input portion (A) 11 are simultaneously exposed onto the wafer 20. Next, the output portion (C) 13 and the input portion (A) 11 are blinded, and only the repetition portion (B) 12 is exposed onto the wafer 20 multiple times. Subsequently, the repetition portion (B) 12 is blinded, and the output portion (C) 13 and the input portion (A) 11 are simultaneously exposed onto the wafer 20. Thus, a desired longitudinal chip having a longitudinal length 49 is produced. In this example, while apart of the reticle 1 is blinded, an exposure of an exposure shot size 49 (hatching part) corresponding to one chip is executed with total five times of exposure shots, i.e., one time of exposure shot of the input portion (A) (and adjoining output portion (C)) and three times of exposure shots of the repetition portion (B) and one time exposure shot of the output portion (C) (and adjoining input portion (A)).

Figure 2:
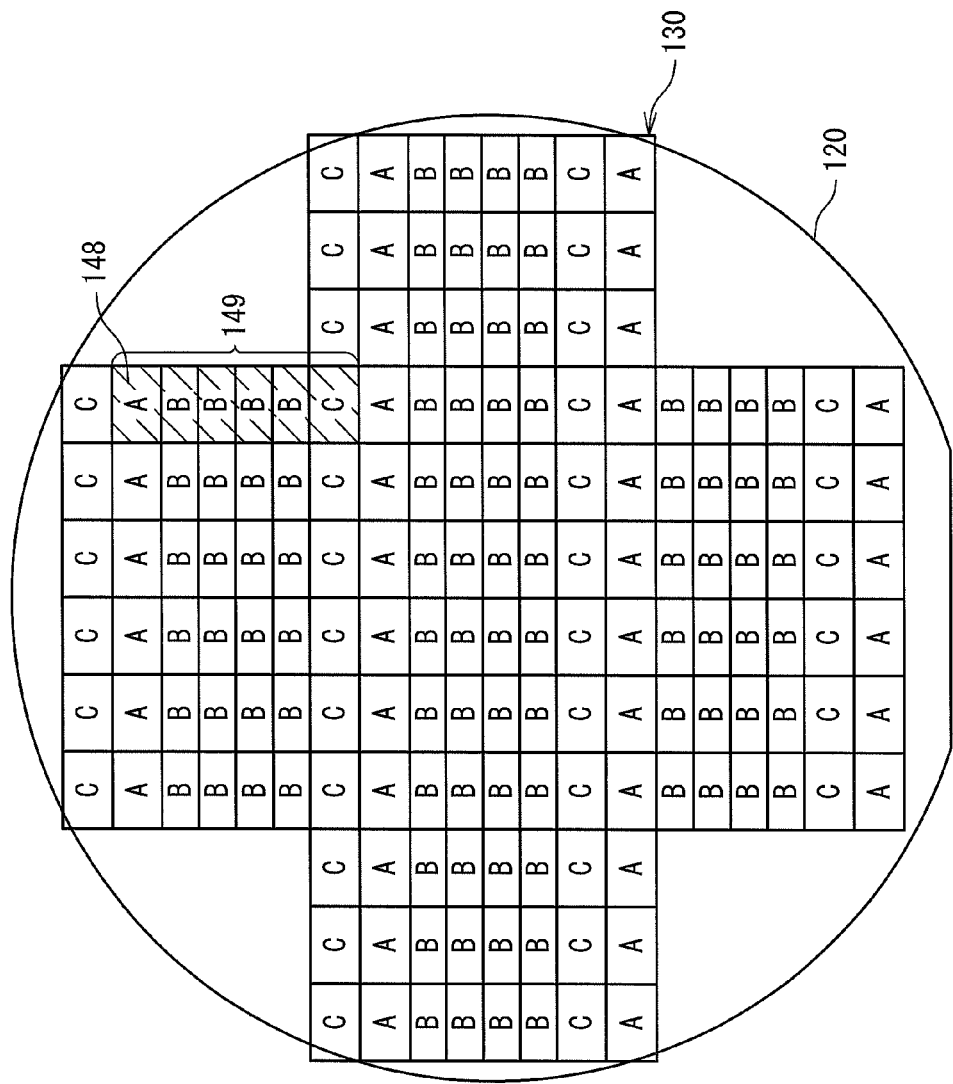
FIG. 2 is a schematic diagram showing an exposure shot map on a wafer using a reticle of FIG. 1.
Figure 5A:
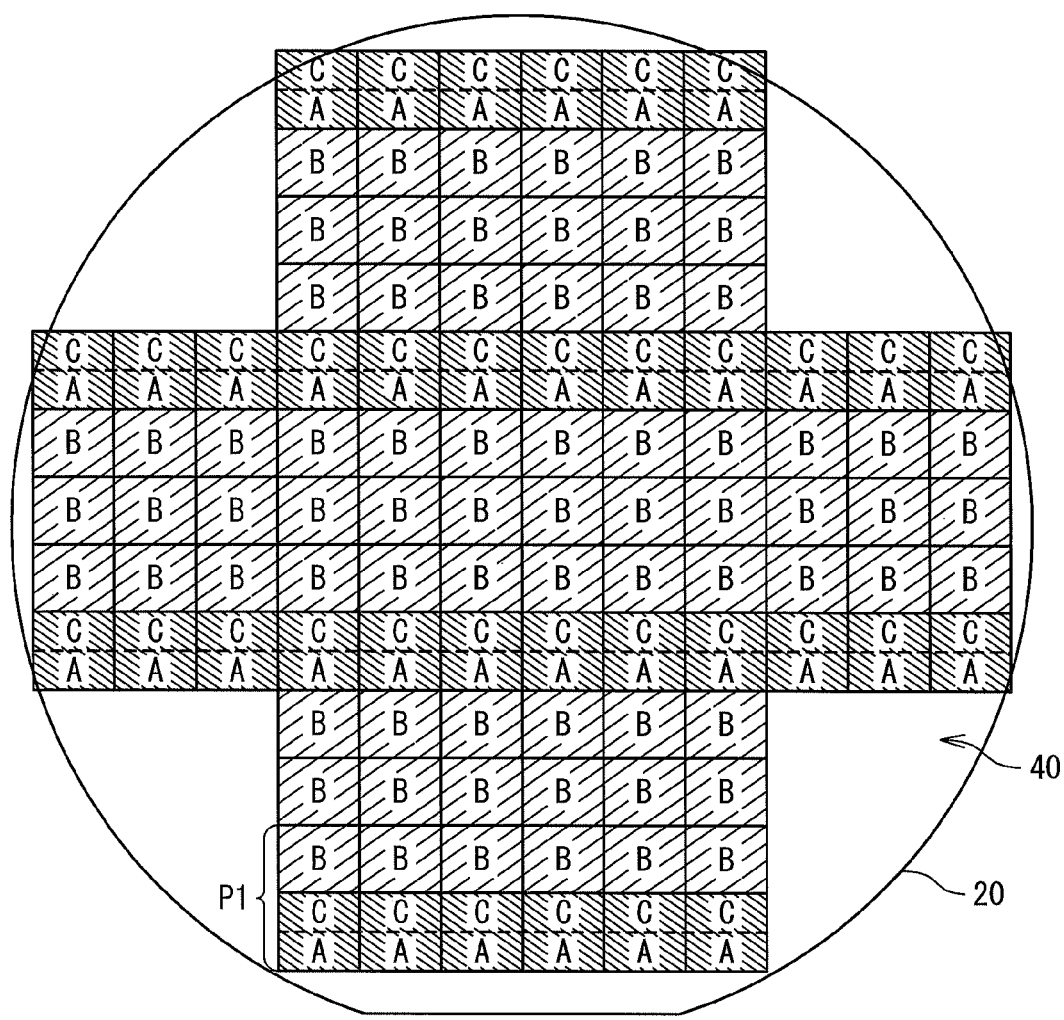
FIG. 5A is a schematic diagram showing an example of a virtual exposure shot map using a reticle of in FIG. 3.
Figure 5B:
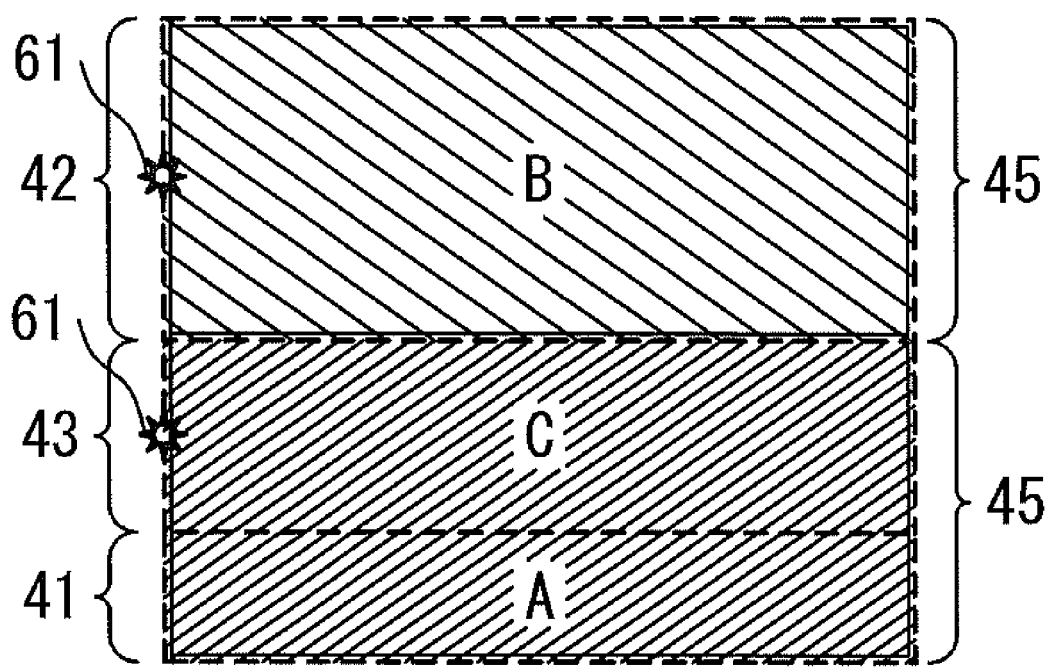
FIG. 5B is a schematic diagram showing an example of a virtual exposure shot map using a reticle of FIG. 3.

FIGS. 5A and 5B are schematic diagrams showing an example of a virtual exposure shot map 40 using the reticle (integer ratio of 1:1) of FIG. 3 and a partial part thereof, respectively. However, FIG. 5B is an enlarged view of a P1 part shown in FIG. 5A. A virtual exposure shot 45 arranged in the virtual exposure shot map 40 is set as a fundamental step at a time of the automatic misalignment measurement. At this time, a longitudinal length of the virtual exposure shot 45 to be set as the fundamental step at a time of the automatic misalignment measurement is set to be a longitudinal length Yb1(=Ya1+Yc1) of the repetition portion (B) 12. That is, the longitudinal length of the virtual exposure shot 45 is not set to be a sum of the longitudinal lengths of a plurality of repetition portions (B) and the longitudinal lengths of one input portion (A) and one output portion (C) as shown in FIG. 2, but set to be a longitudinal length of one repetition portion (B) 12, that is, a sum of a longitudinal length of one input portion (A) and a longitudinal length of one output portion (C). Therefore, one virtual exposure shot 45 (shown by a real line) corresponds to an exposure shot 42 (shown by a broken line) of one repetition portion (B) or corresponds to a sum of an exposure shot 41 (shown by a broken line) of one input portion (A) and an exposure shot 43 (shown by a broken line) of one output portion (C). In other words, in the automatic misalignment measurement, by using the virtual exposure shot 45 as the fundamental step, the misalignment measurement every exposure of the repetition portion (B) 12 and the misalignment measurement every simultaneous exposure of the input portion (A) 11 and the output portion (C) 13 are carried out.

Figure 6:
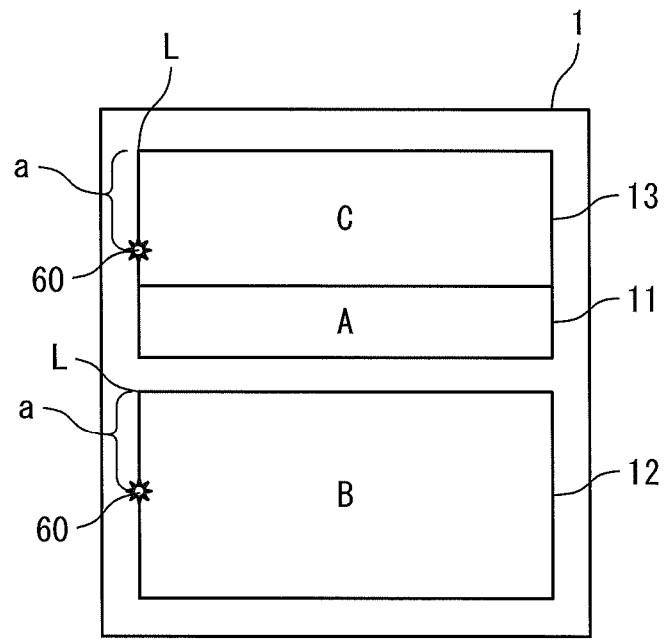
FIG. 6 is a schematic diagram showing an example of an arrangement of a misalignment measurement pattern in a reticle of FIG. 3.

Herein, a misalignment measurement pattern 60 for use in the automatic misalignment measurement is located in the same positions in the repetition portion (B) 12 and in a set of the input portion (A) 11 and the output portion (C) 13. FIG. 6 is a schematic diagram showing an example of an arrangement of a misalignment measurement pattern in the reticle (integer ratio of 1:1) of FIG. 3. In the case where the misalignment measurement pattern 60 is located at a position distant by "a" in the longitudinal direction from a left top end L at a time of exposure shot of the repetition portion (B) 12, the misalignment measurement pattern 60 is also located at a position distant by "a" in the longitudinal direction from a left top end L at a time of exposure shot of the input portion (A) 11 and the output portion (C) 13. Thus, as shown in FIG. 5B, misalignment measurement patterns 61 are formed at corresponding positions on the wafer 20. It may be possible to locate the positions of the misalignment measurement patterns 60 not at the side of each portion (12, 11 and 13), but in the middle of each portion (12, 11 and 13).

In this manner, in the case of an integer ratio of 1:1, the longitudinal length of the virtual exposure shot 45 to be a fundamental step at a time of a automatic misalignment measurement can be set to the same longitudinal length of an actual exposure shot (i.e., the longitudinal length Yb1 of the repetition portion (B) 12 or the sum (Ya1+Yc1) of the longitudinal lengths of the input portion (A) 11 and the output portion (C) 13). By this arrangement, there resolves a limitation in positioning on the wafer 20 for automatic misalignment measurement.

Figure 1:
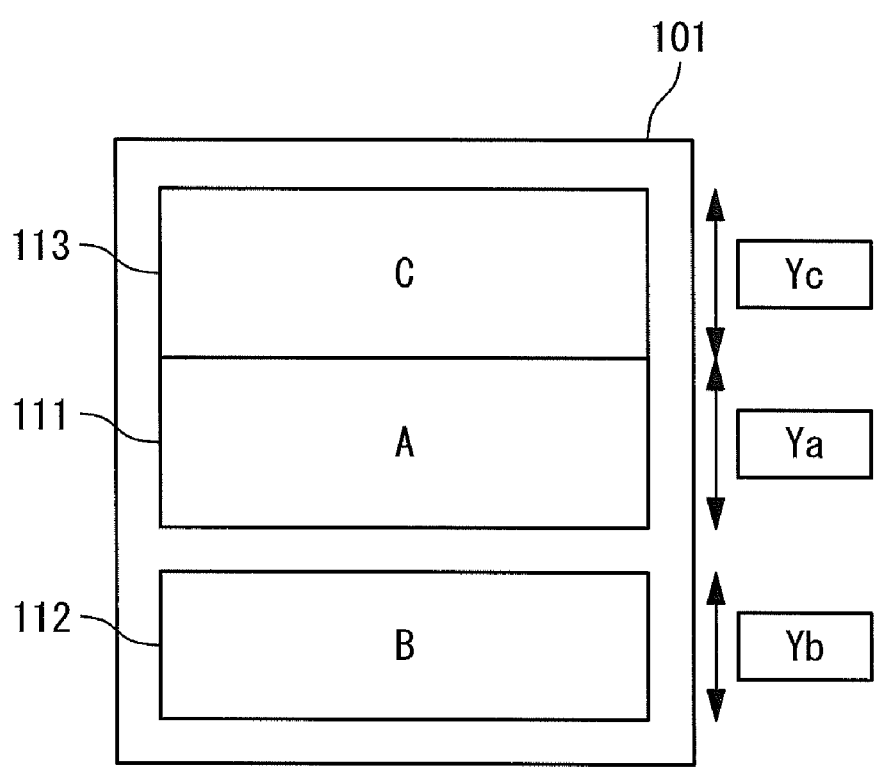
FIG. 1 is a schematic diagram showing a typical reticle layout.

In the present embodiment, by using the reticle 1, when exposing a pattern corresponding to one piece of a solid-state image sensor (CCD), the misalignment measurement patterns 61 can be formed in the same positions at a time of simultaneous exposure of the output portion (C) 13 and the input portion (A) 11 and in the exposure of the repetition portion (B) 12. Thus, the automatic misalignment measurement can be carried out using a very small virtual exposure shot 45 as the fundamental step. That is, the positions of automatic misalignment measurement can be remarkably increased compared to the cases shown in FIGS. 1 and 2. As a result, the accuracy of compensating a misalignment can be remarkably improved. Thus, a design can be made more accurately with a yield to be improved.

Next, the manufacturing method of the solid-state image sensor in the first embodiment of the present invention is carried out in a manner as follows.

First of all, the wafer 20 and the reticle 1 are set to an exposing instrument which includes an offset device and a blind device (step 1). The offset device is configured to move a projection coordinate in parallel. The blind device is configured to blind a part of the reticle.

Then, the repetition portion (B) 12 is first blinded by the exposing instrument. Then, the output portion (C) 13 and the input portion (A) 11 are simultaneously exposed onto the wafer 20 (step 2). Thereafter, a relative position between the wafer 20 and the reticle 1 is shifted (step 3). Then, the input portion (A) 11 and the output portion (C) 13 are blinded by the exposing instrument. Subsequently, only the repetition portion (B) 12 is exposed onto the wafer 20 multiple times (step 4). That is, the exposure of the repetition portion (B) 12 onto the wafer 20 and the shift of the relative position between the wafer 20 and the reticle 1 are executed multiple times. Thereafter, the relative position between the wafer 20 and the reticle 1 is shifted (step 5). Next, the repetition portion (B) 12 is blinded by the exposing instrument. Then, the input portion (A) 11 and the output portion (C) 13 are simultaneously exposed onto the wafer 20 (step 6). The steps mentioned above are repeated in a prescribed area of the wafer 20. Subsequently, the automatic misalignment measurement using the misalignment measurement pattern 61 is carried out with the virtual exposure shot 45 as the fundamental step (step 7). In the automatic misalignment measurement, a misalignment degree in each of the exposure shots is measured, and if the misalignment exceeds a prescribed standard, reconstruction is performed (step 8). The reconstruction means that a photoresist is removed, and then coated and exposed again. At this time, a compensation using a misalignment measurement result is carried out to thereby improve the accuracy.

By the manufacturing method as described above, one desired longitudinal chip (CCD chip) having a longitudinal length 49, i.e., a solid-state image sensor is manufactured. By manufacturing the solid-state image sensor using the reticle 1 in this manner, a limitation of an automatic misalignment measurement position on the wafer 20 can be resolved. That is, the automatic misalignment measurement can be executed at a plurality of positions for one CCD chip. Thus, the accuracy in compensating a misalignment can be improved compared to the cases shown in FIGS. 1 and 2. Thus, it becomes possible to design a solid-state image sensor more accurately and a manufacturing yield thereof can be improved.

(Second Embodiment)

Figure 7:
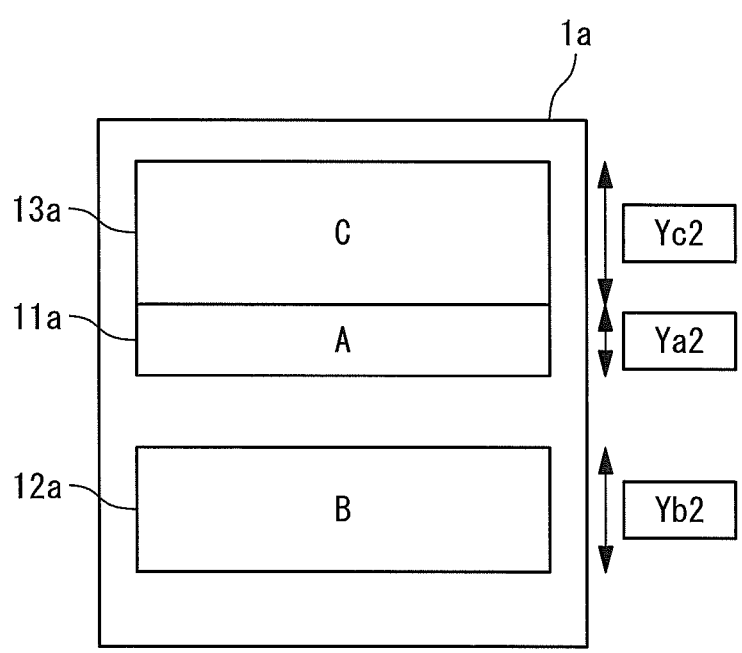
FIG. 7 is a schematic diagram showing an example of a reticle layout according to a second embodiment of the present invention.

A reticle and a manufacturing method of a solid-state image sensor according to a second embodiment of the present invention are described referring to the accompanying drawings. FIG. 7 is a schematic view showing an example of a reticle layout according to the second embodiment of the present invention.

A reticle 1a shown in FIG. 7 is a reticle for use in manufacturing a one-dimensional CCD having a rectangular shape elongated in one side direction. Hereinafter, a longitudinal direction in a chip is merely referred to as "longitudinal direction". The reticle 1a includes a repetition portion (B) 12a, an input portion (A) 11a and an output portion (C) 13a. The repetition portion (B) 12a is a pattern for exposure of a pixel portion. Here, the pixel portion is formed with identical patterns repeated on the same one chip. The identical pattern corresponds to the repetition portion (B) 12. The input portion (A) 11a and the output portion (C) 13a are patterns for exposing a peripheral circuit portion (e.g., an input circuit portion and an output circuit portion) such as an amplifier circuit portion other than the pixel portion. The repetition portion (B) 12a, the input portion (A) 11a and the output portion (C) 13a are provided and aligned in this order from one side.

In this arrangement, it is assumed that a length of the repetition portion (B) 12a in the longitudinal direction is Yb2, a length of the input portion (A) 11a in the longitudinal direction is Ya2, and a length of the output portion (C) 13a in the longitudinal direction is Yc2. At this time, the relation among Yb2, Ya2 and Yc2 is 2×Yb2 =Ya2+Yc2. That is, the ratio between the length Yb2 of the repetition portion (B) 12a in the longitudinal direction and the sum Ya2+Yc2 of the length of the input portion (A) 11a in the longitudinal direction and the length of the output portion (C) 13a in the longitudinal direction is an integer ratio of 1:2. In other words, Ya2+Yc2 is an integral multiple of Yb2 (i.e., n times, herein n=2).

FIG. 8 is a schematic diagram showing an example of an exposure shot map 30a on a wafer using the reticle (integer ratio of 1:2) of FIG. 7. In an exposure step, the repetition portion (B) 12a is first blinded, and the output portion (C) 13a and the input portion (A) 11a are simultaneously exposed onto the wafer 20. Next, the output portion (C) 13a and the input portion (A) 11a are blinded, and only the repetition portion (B) 12a 1is exposed onto the wafer 20a multiple times. Subsequently, the repetition portion (B) 12a is blinded, and the output portion (C) 13a and the input portion (A) 11a are simultaneously exposed onto the wafer 20a. Thus, a desired longitudinal chip having a longitudinal length 49a is produced. In this example, while a part of the reticle 1a is blinded, an exposure of an exposure shot size 48a (hatching part) corresponding to one chip is executed with total eight times of exposure shots, i.e., one time exposure shot of the input portion (A) (and adjoining output portion (C)) and six times exposure shots of the repetition portion (B) and one time exposure shot of the output portion (C) (and adjoining input portion (A)).

Figure 9A:
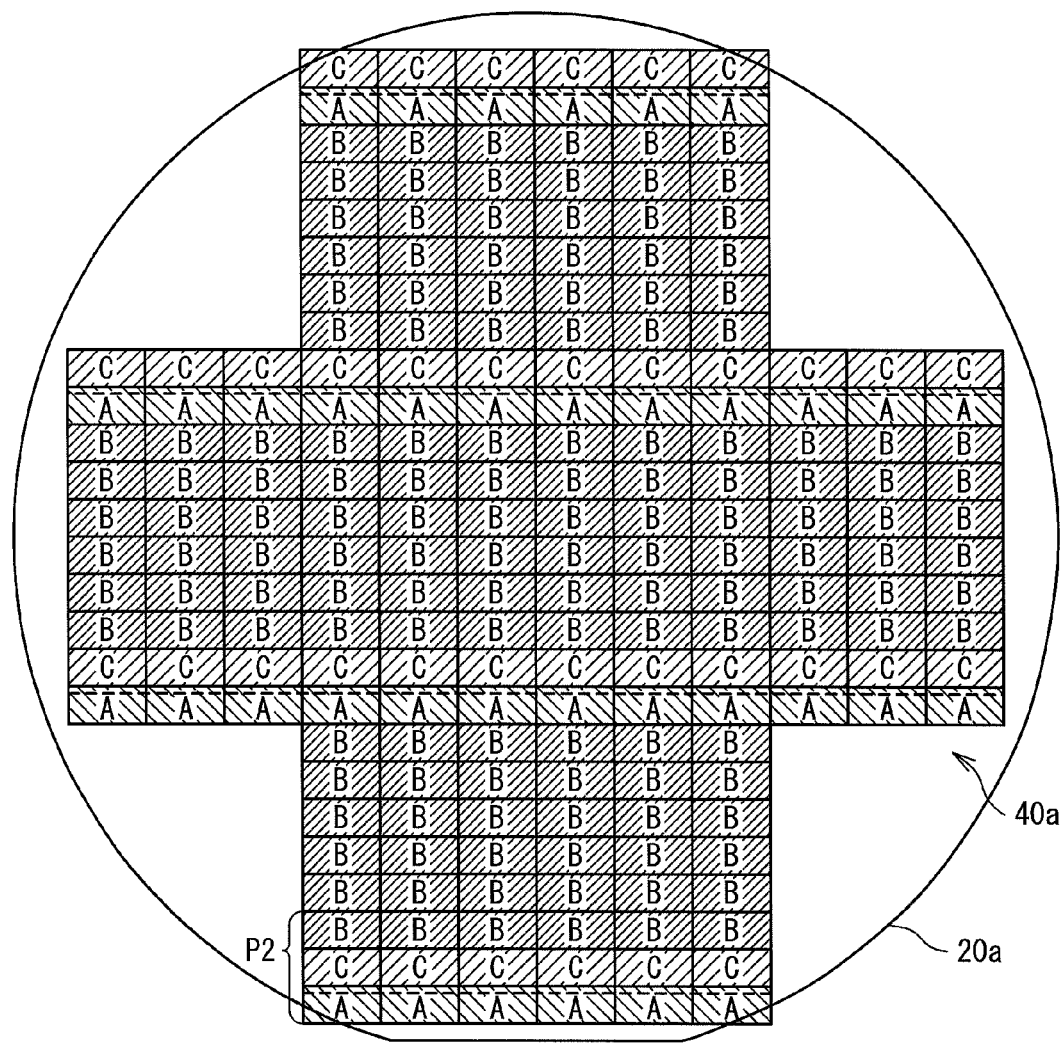
FIG. 9A is a schematic diagram showing an example of a virtual exposure shot map using a reticle of FIG. 7.
Figure 9B:
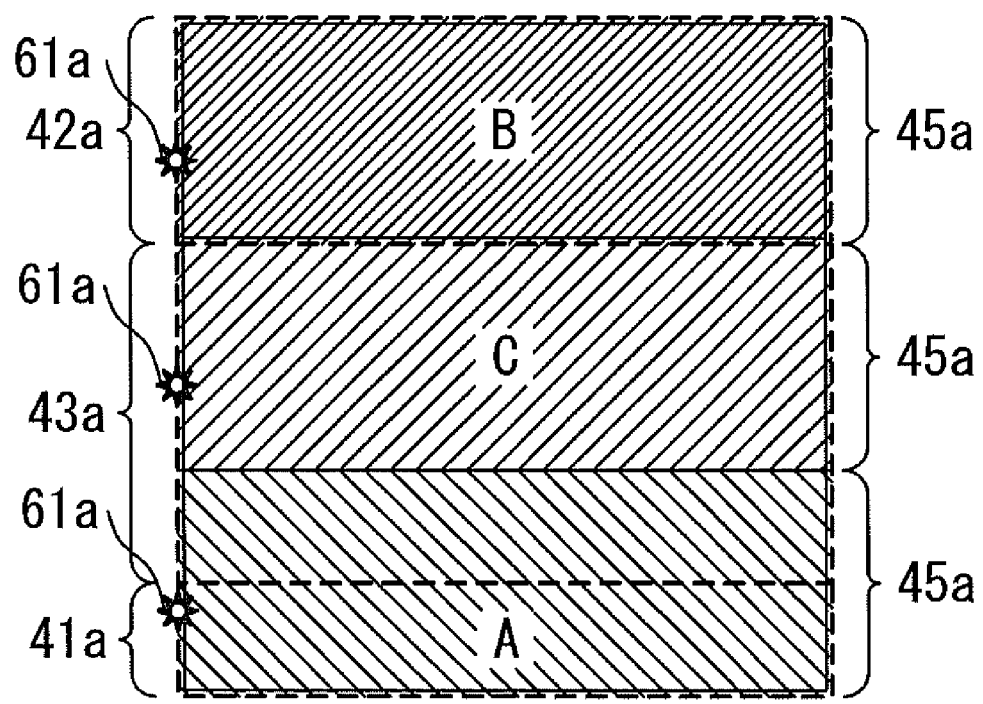
FIG. 9B is a schematic diagram showing an example of a virtual exposure shot map using a reticle of FIG. 7.

FIGS. 9A and 9B are schematic diagrams showing an example of a virtual exposure shot map 40a using the reticle (integer ratio of 1:2) of FIG. 7 and a partial part thereof, respectively. However, FIG. 9B is an enlarged view of a P2 part shown in FIG. 9A. A virtual exposure shot 45a arranged in the virtual exposure shot map 40a is set as a fundamental step at a time of the automatic misalignment measurement. At this time, a longitudinal length of the virtual exposure shot 45a to be set as the fundamental step at a time of the automatic misalignment measurement is set to be a longitudinal length Yb2(=(Ya2+Yc2)/2) of the repetition portion (B) 12a. That is, the longitudinal length of the virtual exposure shot 45a is not set to be a sum of the longitudinal lengths of a plurality of repetition portions (B) and the longitudinal lengths of one input portion (A) and one output portion (C), but set to be a longitudinal length of one repetition portion (B) 12a, that is equal to (a sum of a longitudinal length of one input portion (A) and a longitudinal length of one output portion (C))/2. Therefore, one virtual exposure shot 45a (shown by a real line) corresponds to an exposure shot 42a (shown by a broken line) of one repetition portion (B) or corresponds to a half of (a sum of an exposure shot 41a (shown by a broken line) of one input portion (A) and an exposure shot 43a (shown by a broken line) of one output portion (C)). In other words, in the automatic misalignment measurement, by using the virtual exposure shot 45a as the fundamental step, the misalignment measurement every exposure of the repetition portion (B) 12a and the misalignment measurement every half exposure of the input portion (A) 11a and the output portion (C) 13a are carried out.

Figure 10:
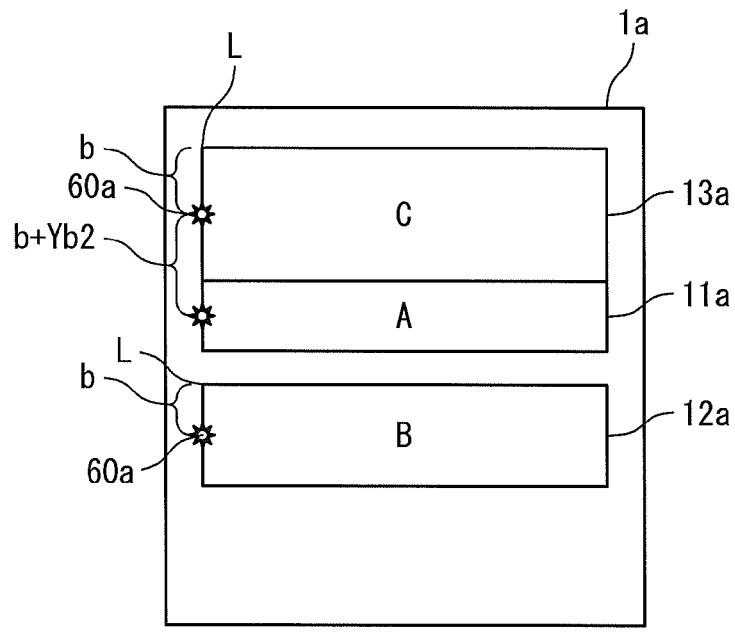
FIG. 10 is a schematic diagram showing an example of an arrangement of a misalignment measurement pattern in a reticle of FIG. 7.

Herein, a misalignment measurement pattern 60a for use in the automatic misalignment measurement is located in the same positions, one in the repetition portion (B) 12a, one in the first half of the sum of the longitudinal length of the input portion (A) 11a and the longitudinal length of the output portion (C) 13a, and one in the second half thereof. FIG. 10 is a schematic diagram showing an example of an arrangement of a misalignment measurement pattern in the reticle (integer ratio of 1:2) of FIG. 7. In the case where the misalignment measurement pattern 60a is located at a position distant by "b" in the longitudinal direction from a left top end L at a time of exposure shot of the repetition portion (B) 12a, the misalignment measurement patterns 60a are also located at positions distant by "b" and "b+Yb2" in the longitudinal direction from a left top end L at a time of exposure shot of the input portion (A) 11a and the output portion (C) 13a. Thus, as shown in FIG. 9B, misalignment measurement patterns 61a are formed at corresponding positions on the wafer 20.

In this manner, in case of the integer ratio of 1:2, the longitudinal length of the virtual exposure shot 45a to be a fundamental step at a time of automatic misalignment measurement is set to the longitudinal length Yb2 of the repetition portion (B) 12a that is equal to a half of the sum of the longitudinal lengths of the input portion (A) 11a and the output portion (C) 13a, i.e., (Ya2+Yc2)/2. By this arrangement, since the misalignment measurement pattern positions in the virtual exposure shot 45a are the same positions in any of the virtual exposure shot 45a, there resolves a limitation in positioning on the wafer for automatic misalignment measurement.

Also, in the present embodiment, by using the reticle 1a, when exposing a pattern corresponding to one piece of a solid-state image sensor (CCD), the misalignment measurement patterns 61a can be formed in the same positions at a time of the simultaneous exposure of the output portion (C) 13a and the input portion (A) 11a and at a time of the exposure of the repetition portion (B) 12a. Thus, the automatic misalignment measurement can be carried out using a very small virtual exposure shot 45a as the fundamental step. That is, the positions of automatic misalignment measurement can be remarkably increased compared to the cases shown in FIGS. 1 and 2. As a result, the accuracy of compensating a misalignment can be remarkably improved. Thus, a design can be made more accurately with a yield to be improved.

Next, the manufacturing method of the solid-state image sensor in the second embodiment of the present invention is carried out in a manner as follows.

First of all, the wafer 20a and the reticle 1a are set to an exposing instrument which includes an offset device for moving a projection coordinate in parallel and a blind device for blinding a part of the reticle (step 1).

Then, the repetition portion (B) 12a is first blinded by the exposing instrument. Then, the output portion (C) 13a and the input portion (A) 11a are simultaneously exposed onto the wafer 20a (step 2). Thereafter, a relative position between the wafer 20a and the reticle 1a is shifted (step 3). Then, the output portion (C) 13a and the input portion (A) 11a are blinded by the exposing instrument. Subsequently, only the repetition portion (B) 12a is exposed onto the wafer 20a multiple times (step 4). That is, the exposure of the repetition portion (B) 12a onto the wafer 20a and the shift of the relative position between the wafer 20a and the reticle 1a are executed multiple times. Thereafter, the relative position between the wafer 20a and the reticle la is shifted (step 5). Next, the repetition portion (B) 12a is blinded by the exposing instrument. Then, the input portion (A) 11a and the output portion (C) 13a are simultaneously exposed onto the wafer 20a (step 6). The steps mentioned above are repeated in a prescribed area of the wafer 20a. Subsequently, the automatic misalignment measurement using the misalignment measurement pattern 61a is carried out with the virtual exposure shot 45a as the fundamental step (step 7). In the automatic misalignment measurement, a misaligned degree in each of the exposure shots is measured, and if the misalignment exceeds a prescribed standard, reconstruction is performed (step 8). The reconstruction means that a photoresist is removed, and then coated and exposed again. At this time, a compensation using a misalignment measurement result is carried out to thereby improve accuracy.

By the manufacturing method as described above, one desired longitudinal chip (CCD chip) having a longitudinal length 49a, i.e., a solid-state image sensor is manufactured. Also, in this case, a similar effect to the first embodiment can be obtained.

(Third Embodiment)

Figure 11:
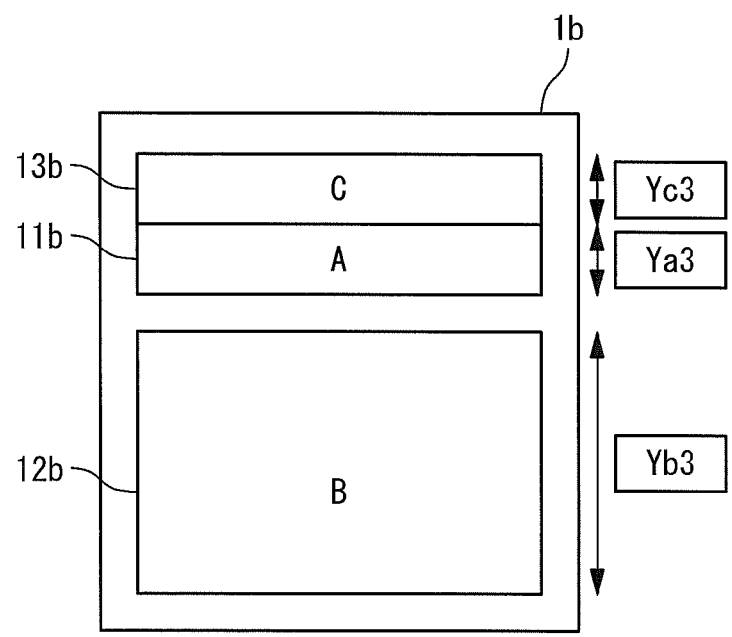
FIG. 11 is a schematic diagram showing an example of a reticle layout according to a third embodiment of the present invention.

A reticle and a manufacturing method of a solid-state image sensor according to a third embodiment of the present invention are described referring to the accompanying drawings. FIG. 11 is a schematic view showing an example of a reticle layout according to the third embodiment of the present invention.

A reticle 1b shown in FIG. 11 is a reticle for use in manufacturing a one-dimensional CCD having a rectangular shape elongated in one side direction. Hereinafter, a longitudinal direction in a chip is merely referred to as "longitudinal direction". The reticle 1b includes a repetition portion (B) 12b, an input portion (A) 11b and an output portion (C) 13b. The repetition portion (B) 12b is a pattern for exposure of a pixel portion. Here, the pixel portion is formed with identical patterns repeated on the same one chip. The identical pattern corresponds to the repetition portion (B) 12. The input portion (A) 11b and the output portion (C) 13b are patterns for exposing a peripheral circuit portion (e.g., an input circuit portion and an output circuit portion) such as an amplifier circuit portion other than the pixel portion. The repetition portion (B) 12b, the input portion (A) 11b and the output portion (C) 13b are provided and aligned in this order from one side.

In this arrangement, it is assumed that a length of the repetition portion (B) 12b in the longitudinal direction is Yb3, a length of the input portion (A) 11b in the longitudinal direction is Ya3, and a length of the output portion (C) 13b in the longitudinal direction is Yc3. At this time, the relation among Yb3, Ya3 and Yc3 is Yb3=2×(Ya3+Yc3). That is, the ratio between the length Yb3 of the repetition portion (B) 12b in the longitudinal direction and the sum Ya3+Yc3 of the length of the input portion (A) 11b in the longitudinal direction and the length of the output portion (C) 13b in the longitudinal direction is an integer ratio of 2:1. In other words, Yb3 is an integral multiple of Ya3+Yc3 (i.e., n times, herein n=2).

Figure 12:
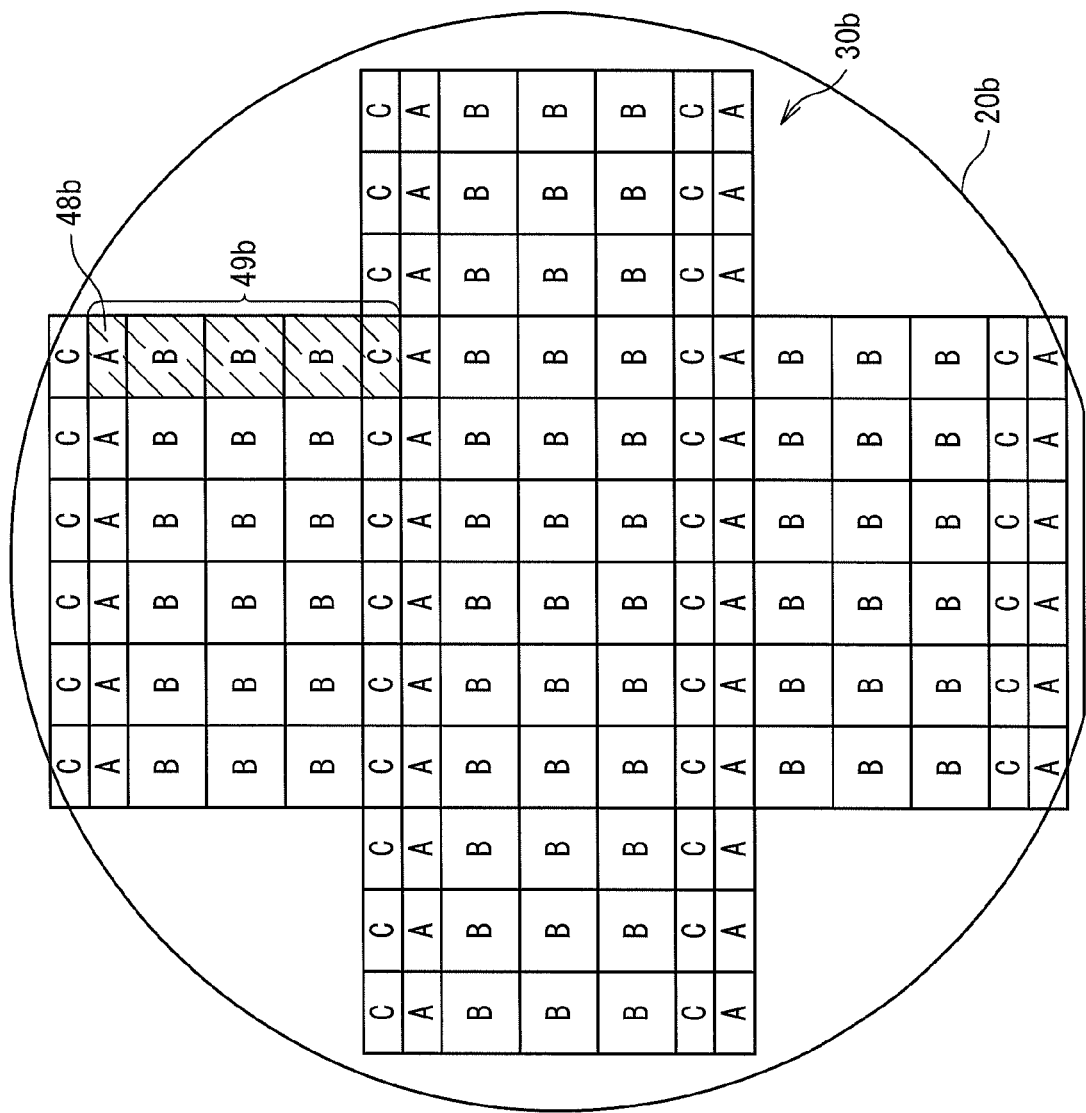
FIG. 12 is a schematic diagram showing an example of an exposure shot map on a wafer using a reticle of FIG. 11.

FIG. 12 is a schematic diagram showing an example of an exposure shot map 30b on a wafer using the reticle (integer ratio of 2:1) of FIG. 11. In an exposure step, the repetition portion (B) 12b is first blinded, and the output portion (C) 13b and the input portion (A) 11b are simultaneously exposed onto the wafer 20b. Next, the output portion (C) 13b and the input portion (A) 11b are blinded, and only the repetition portion (B) 12b is exposed onto the wafer 20b multiple times. Subsequently, the repetition portion (B) 12b is blinded, and the output portion (C) 13b and the input portion (A) 11b are simultaneously exposed onto the wafer 20b. Thus, a desired longitudinal chip having a longitudinal length 49b is produced. In this example, while a part of the reticle 1b is blinded, an exposure of an exposure shot size 48b (hatching part) corresponding to one chip is executed with total five times of exposure shots, i.e., one time exposure shot of the input portion (A) (and adjoining output portion (C)) and three times exposure shots of the repetition portion (B) and one time exposure shot of the output portion (C) (and adjoining input portion (A)).

Figure 13A:
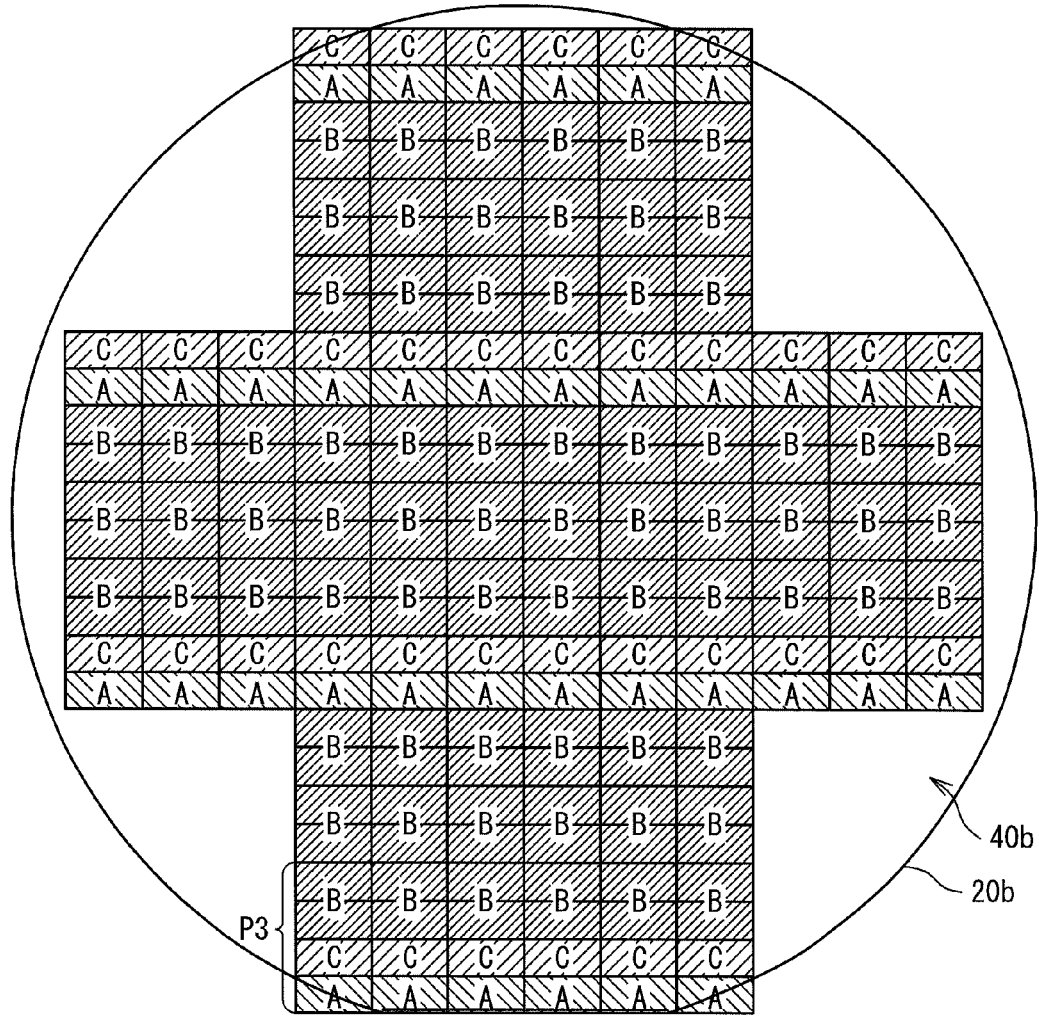
FIG. 13A is a schematic diagram showing an example of a virtual exposure shot map using a reticle of FIG. 11.
Figure 13B:
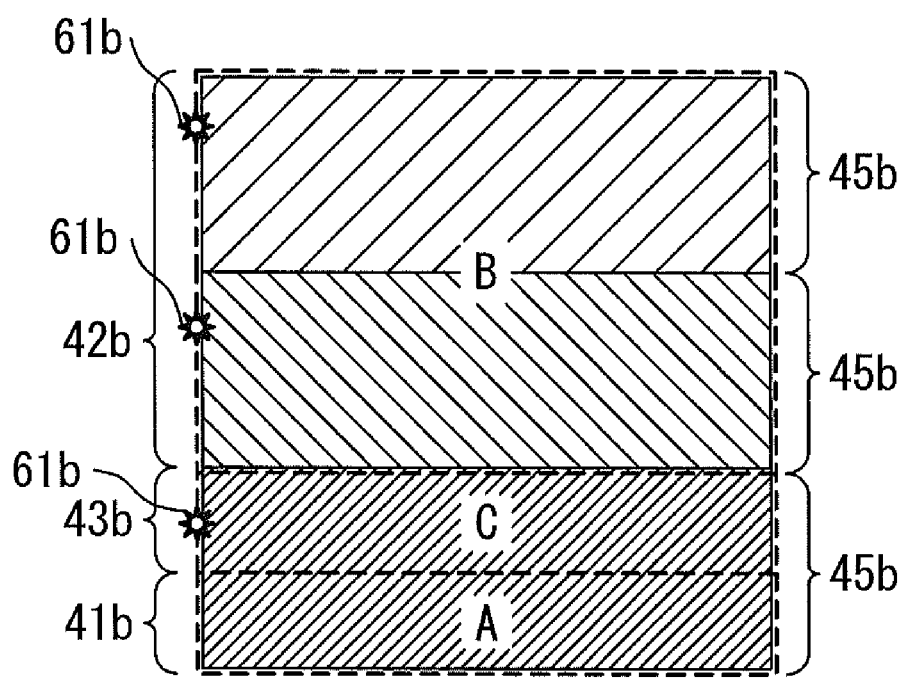
FIG. 13B is a schematic diagram showing an example of a virtual exposure shot map using a reticle of FIG. 11.

FIGS. 13A and 13B are schematic diagrams showing an example of a virtual exposure shot map 40b using the reticle of (integer ratio of 2:1) FIG. 11 and a partial part thereof, respectively. However, FIG. 13B is an enlarged view of a P3 part shown in FIG. 13A. A virtual exposure shot 45b arranged in the virtual exposure shot map 40b is set as a fundamental step at a time of automatic misalignment measurement. At this time, a longitudinal length of the virtual exposure shot 45b to be set as the fundamental step at a time of automatic misalignment measurement is set to be Yb3/2(=Ya3+Yc3) that is a half of a longitudinal length of the repetition portion (B) 12b. In other words, the longitudinal length of the virtual exposure shot 45b is not set to be a sum of the longitudinal lengths of a plurality of repetition portions (B) and the longitudinal lengths of one input portion (A) and one output portion (C), but set to be a half of a longitudinal length of one repetition portion (B) 12b, that is equal to a sum of a longitudinal length of one input portion (A) and a longitudinal length of one output portion (C). Therefore, one virtual exposure shot 45b (shown by a real line) corresponds to a half of an exposure shot 42b (shown by a broken line) of one repetition portion (B) or corresponds to a sum of an exposure shot 41b (shown by a broken line) of one input portion (A) and an exposure shot 43b (shown by a broken line) of one output portion (C)). In other words, in the automatic misalignment measurement, by using the virtual exposure shot 45b as the fundamental step, the misalignment measurement every half of an exposure of the repetition portion (B) 12b and the misalignment measurement every exposure of the input portion (A) 11b and the output portion (C) 13b are carried out.

Figure 14:
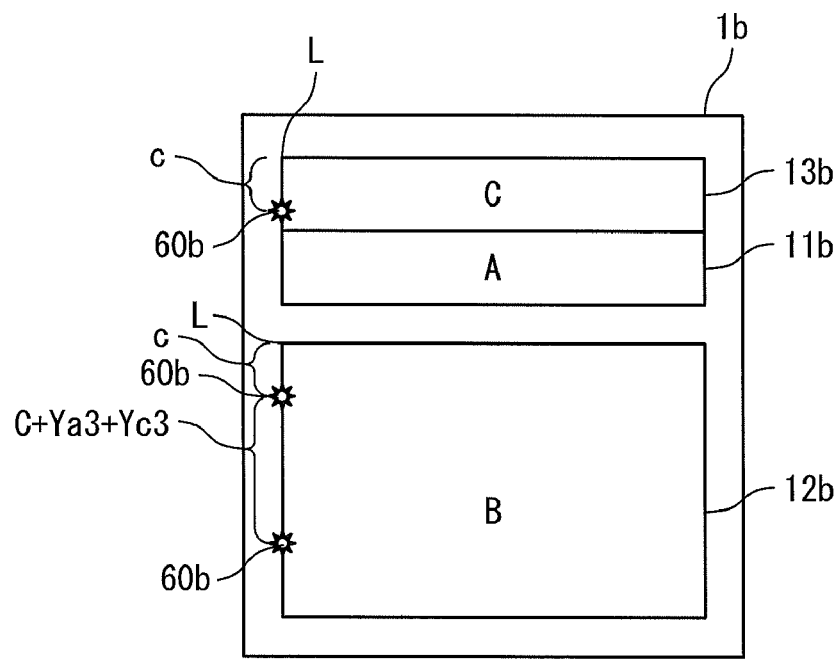
FIG. 14 is a schematic diagram showing an example of an arrangement of a misalignment measurement pattern in a reticle of FIG. 11.

Herein, a misalignment measurement pattern 60b for use in the automatic misalignment measurement is located in the same positions, one in the first half of the longitudinal length of the repetition portion (B) 12b, one in the second half thereof, and one in the sum of the longitudinal length of the input portion (A) 11b and the output portion (C) 13b. FIG. 14 is a schematic diagram showing an example of an arrangement of a misalignment measurement pattern in the reticle (integer ratio of 1:2) of FIG. 11. In the case where the misalignment measurement pattern 60b is located at a position distant by "c" in the longitudinal direction from a left top end L at a time of exposure shot of the input portion (A) 11b and the output portion (C) 13b, the misalignment measurement patterns 60b are also located at positions distant by "c" and "c+(Ya3 +Yc3)" in the longitudinal direction from a left top end L at a time of exposure shot of the repetition portion (B) 12b. Thus, as shown in FIG. 13B, a misalignment measurement pattern 61b is formed at corresponding positions on the wafer 20b.

In this manner, in case of the integer ratio of 2:1, the longitudinal length of the virtual exposure shot 45b to be a fundamental step at a time of automatic misalignment measurement is set to be the sum (Ya2+Yc2) of the longitudinal lengths of the input portion (A) and the output portion (C), that is equal to a half (Yb3/2) of the longitudinal length Yb3 of the repetition portion (B) 12b. By this arrangement, since the misalignment measurement pattern positions in the virtual exposure shot 45b are the same positions in any of the virtual exposure shot 45b, there resolves a limitation in positioning on the wafer for automatic misalignment measurement.

Also, in the present embodiment, by using the reticle 1b, when exposing a pattern corresponding to one piece of a solid-state image sensor (CCD), the misalignment measurement patterns 61b can be formed in the same positions at a time of simultaneous exposure of the output portion (C) 13b and the input portion (A) 11b and at a time of the exposure of the repetition portion (B) 12b. Thus, the automatic misalignment measurement can be carried out using a very small virtual exposure shot 45b as the fundamental step. That is, the positions of automatic misalignment measurement can be remarkably increased compared to the cases shown in FIGS. 1 and 2. As a result, the accuracy of compensating a misalignment can be remarkably improved. Thus, a design can be made more accurately with a yield to be improved.

Next, the manufacturing method of the solid-state image sensor in the third embodiment of the present invention is carried out in a manner as follows.

First of all, the wafer 20b and the reticle 1b are set to an exposing instrument which includes an offset device for moving a projection coordinate in parallel and a blind device for blinding a part of the reticle (step 1).

Then, the repetition portion (B) 12b is first blinded by the exposing instrument. Then, the output portion (C) 13b and the input portion (A) 11b are simultaneously exposed onto the wafer 20b (step 2). Thereafter, a relative position between the wafer 20b and the reticle 1b is shifted (step 3). Then, the output portion (C) 13b and the input portion (A) 11b are blinded by the exposing instrument. Subsequently, only the repetition portion (B) 12b is exposed onto the wafer 20b multiple times (step 4). That is, the exposure of the repetition portion (B) 12b onto the wafer 20b and the shift of the relative position between the wafer 20b and the reticle 1b are executed multiple times. Thereafter, the relative position between the wafer 20b and the reticle 1b is shifted (step 5). Next, the repetition portion (B) 12b is blinded by the exposing instrument. Then, the output portion (C) 13b and the input portion (A) 11b are simultaneously exposed onto the wafer 20b (step 6). The steps mentioned above are repeated in a prescribed area of the wafer 20b. Subsequently, the automatic misalignment measurement using the misalignment measurement pattern 61b is carried out with the virtual exposure shot 45b as the fundamental step (step 7). In the automatic misalignment measurement, a misaligned degree in each of the exposure shots is measured, and if the misalignment exceeds a prescribed standard, reconstruction is performed (step 8). The reconstruction means that a photoresist is removed, and then coated and exposed again. At this time, a compensation using a misalignment measurement result is carried out to thereby improve the accuracy.

By the manufacturing method as described above, one desired longitudinal chip (CCD chip) having a longitudinal length 49b, i.e., a solid-state image sensor is manufactured. Also, in this case, a similar effect to the first embodiment can be obtained.

In the first to third embodiments, the relation between the longitudinal length of the repetition portion (B) and the sum of the longitudinal lengths of the input portion (A) and the output portion (C) is set to be an integer ratio (i.e., one is integral multiple of the other), and any shorter one of the longitudinal length of the repetition portion (B) and the sum of the longitudinal lengths of the input portion (A) and the output portion (C) is set to a longitudinal length of the virtual exposure shot at a time of automatic misalignment measurement. Thus, it becomes possible to resolve a positional limitation on the wafer in positioning an automatic misalignment measurement. If the relation is not an integer ratio (integral multiple), when there are a plurality of chip formations in the longitudinal direction on the wafer, even if any shorter one of the longitudinal length of the repetition portion (B) and the sum of the longitudinal lengths of the input portion (A) and the output portion (C) is set to a longitudinal length of the virtual exposure shot at a time of automatic misalignment measuring, the virtual exposure shot and an actual exposure shot are displaced from each other, and a misalignment cannot be measured.

Figure 15:
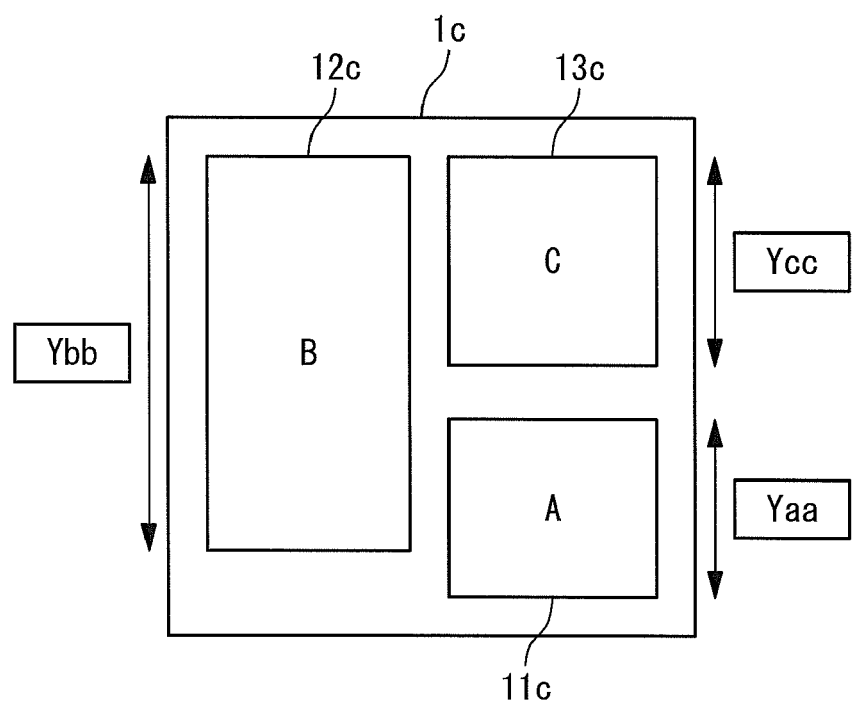
FIG. 15 is a schematic diagram showing an application example of a reticle layout according to an embodiment of the present invention.
Figure 16:
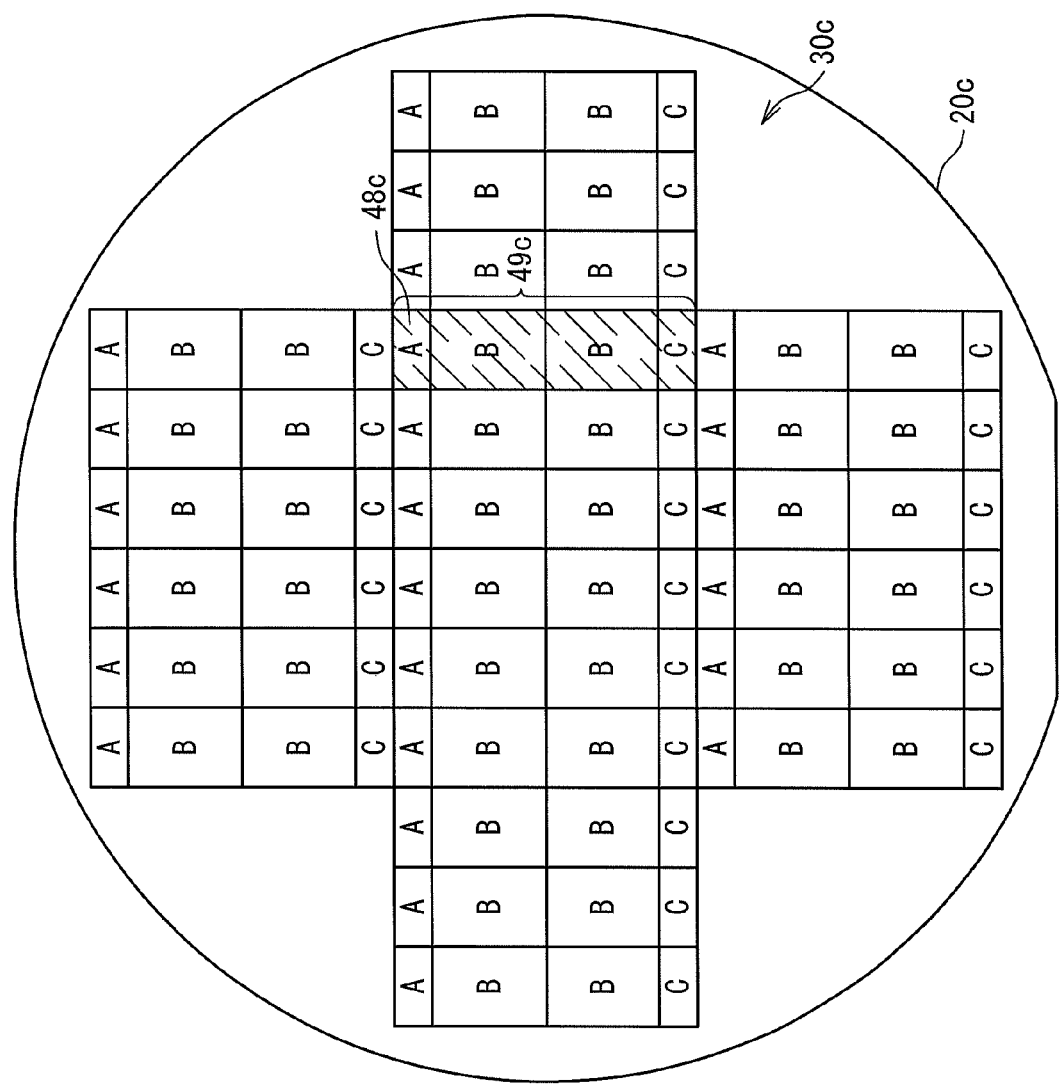
FIG. 16 is a schematic diagram showing an example of an exposure shot map on a wafer using a reticle of FIG. 15.

In the first to third embodiments, it is considered that the input portion (A) and the output portion (C) are simultaneously exposed while the repetition portion (B) is blinded. However, even in the case where these parts (A), (B) and (C) are separately exposed, the technique in each of the embodiments can be similarly applied. In addition, in the first to third embodiments, the repetition portion (B), the input portion (A) and the output portion (C) are lengthwise arranged in the longitudinal direction of the reticle. However, even in the case where these parts are laterally arranged, the technique in each of the embodiments can be similarly applied. FIGS. 15 and 16 show an example thereof as follows.

FIG. 15 is a schematic diagram showing an application example of a reticle layout according to an embodiment of the present invention. FIG. 16 is a schematic diagram showing an example of an exposure shot map 30c on the wafer using the reticle of FIG. 15. Even in this reticle layout, a ratio in length of Ybb to Yaa+Ycc is set to be an integral multiple, and the longitudinal length of the virtual exposure shot in a misalignment measurement is set to any shorter one of Ybb and (Yaa+Ycc), and each of the repetition portion (B), the input portion (A) and the output portion (C) is separately exposed while every two of the three parts blinded. Thus, the effect similar to the first to third embodiments can be obtained.

Further, the present invention is not limited to a solid-state image sensor, and can used similarly to other elements such as, for example, one part of a reticle is blinded and exposure is executed using the other part, and the thereafter the exposure is executed using the corresponding one part while the other part is blinded.

It is apparent that the present invention is not limited to the above embodiment, but may be modified and changed without departing from the scope and spirit of the invention. The technique in each of the embodiments can be applied to other embodiments unless a contradiction arises.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A reticle comprising:
    a repetition pattern; and
    a peripheral pattern,
    wherein one of said repetition pattern and peripheral pattern is a first pattern with a first side in a first direction and the other is a second pattern with a second side in said first direction, said first side having a first length equal to or longer than a second length of said second side,
    wherein said first length is n (n is an integer equal to or larger than 1) times as large as said second length,
    wherein said first pattern has at least one of first misalignment measurement patterns provided at positions distant by a third length and ((said third length)+(n−1)×(said second length)) from an upper end of said first pattern, said third length being equal to or smaller than said second length, and
    wherein said second pattern has a second misalignment measurement pattern provided at a position distant by said third length from an upper end of said second pattern.

2. The reticle according to claim 1, wherein said n is one of 1 and 2.

3. The reticle according to claim 1, wherein a length of a virtual exposure shot in said first direction is said second length at a time of an automatic misalignment measurement.

4. The reticle according to claim 1, wherein said repetition pattern includes:
    a first pattern representing a pixel portion of a CCD (Charge Coupled Device),
    wherein said peripheral pattern includes:
    a second pattern representing a peripheral circuit portion of said CCD.

5. The reticle according to claim 4, wherein said second pattern includes:
    patterns representing an input circuit portion and an output circuit portion.

6. The reticle according to claim 1, wherein said first side and said second side are aligned in said first direction.

7. A method of manufacturing a solid-state image sensor, comprising:
    setting a wafer and a reticle to an exposing instrument, wherein said reticle includes:
        a repetition pattern representing a pixel portion of a CCD (Charge Coupled Device), and
        a peripheral pattern representing a peripheral circuit portion of said CCD,
        wherein one of said repetition pattern and peripheral pattern is a first pattern with a first side in a first direction and the other is a second pattern with a second side in said first direction, said first side having a first length equal to or longer than a second length of said second side, wherein said first length is n (n is an integer equal to or larger than 1) times as large as said second length, wherein said first pattern has at least one of first misalignment measurement patterns provided at positions distant by a third length and ((said third length)+(n−1)×(said second length)) from an upper end of said first pattern, said third length being equal to or smaller than said second length, and wherein said second pattern has a second misalignment measurement pattern provided at a position distant by said third length from an upper end of said second pattern;

blinding said peripheral pattern and exposing said repetition portion multiple times on said wafer;

blinding said repetition portion and exposing said peripheral pattern on said wafer; and carrying out an automatic misalignment measurement using said at least one of first misalignment measurement patterns and said second misalignment measurement pattern.

8. The method of manufacturing a solid-state image sensor according to claim 7, wherein said n is one of 1 and 2.

9. The method of manufacturing a solid-state image sensor according to claim 7, wherein a length of a virtual exposure shot in said first direction is said second length at a time of carrying out said automatic misalignment measurement.

10. The method of manufacturing a solid-state image sensor according to claim 7, wherein said peripheral pattern includes:

patterns representing an input circuit portion and an output circuit portion.

11. The method of manufacturing a solid-state image sensor according to claim 7, wherein said first side and said second side are aligned in said first direction.

\* \* \* \* \*